United States Patent
Lou

[11] Patent Number: 6,133,088
[45] Date of Patent: Oct. 17, 2000

[54] METHOD OF FORMING CROWN-SHAPED CAPACITOR

[75] Inventor: Chine-Gie Lou, Hsinchu Hsien, Taiwan

[73] Assignee: Worldwide Semiconductor Manufacturing Corp, Hsinchu, Taiwan

[21] Appl. No.: 09/488,955

[22] Filed: Jan. 21, 2000

[30] Foreign Application Priority Data

Dec. 6, 1999 [TW] Taiwan ................. 88121287

[51] Int. Cl.⁷ ............................... H01L 21/8242
[52] U.S. Cl. ................. 438/253; 438/255; 438/398
[58] Field of Search ..................... 438/239, 253, 438/254, 255, 396, 397, 398

[56] References Cited

U.S. PATENT DOCUMENTS

| | | | |
|---|---|---|---|
| 5,721,168 | 2/1998 | Wu | 438/253 |
| 5,956,587 | 9/1999 | Chen et al. | 438/255 |
| 6,071,772 | 6/2000 | Chao | 438/253 |

*Primary Examiner*—Charles Bowers
*Assistant Examiner*—Jack Chen
*Attorney, Agent, or Firm*—J. C. Patents; Jiawei Huang

[57] ABSTRACT

A method of forming a crown-shaped capacitor. A dielectric layer, a stopping layer and a first material layer are sequentially formed over a substrate, and then a contact plug is formed through the three layers above the substrate. A first doped amorphous silicon layer and a second material layer are sequentially formed over the first material layer and the contact plug. The second material layer and the first doped amorphous silicon layer are patterned to form an opening that exposes the contact plug. A second doped amorphous silicon layer is formed over the exposed surface of the opening and above the second material layer on each side of the opening. The second doped amorphous silicon layer also covers the sidewalls of the second material layer and the first amorphous silicon layer to form doped amorphous silicon spacers. The second material layer and the first material layer are removed. The stopping layer is removed to form a lower electrode structure that includes the first doped amorphous silicon layer, the second doped amorphous silicon layer, the doped amorphous silicon spacers and a portion of the contact plug.

15 Claims, 7 Drawing Sheets

METHOD OF FORMING CROWN-SHAPED CAPACITOR

CROSS-REFERENCE TO RELATED APPLICATION

This application claims the priority benefit of Taiwan application serial no. 88121287, filed Dec. 6, 1999.

BACKGROUND OF THE INVENTION

1. Field of the Invention

The present invention relates to a method of forming the capacitor of a semiconductor memory device. More particularly, the present invention relates to a method of forming the crown-shaped capacitor of a dynamic random access memory (DRAM).

2. Description of the Related Art

In integrated circuits with deep-submicron line width, the dimension of each device is greatly reduced. Consequently, space left for forming the capacitor of a DRAM unit shrinks. However, due to the rapid increase in size of software programs, there is an exponential increase in memory requirement. Hence, small-size high-capacity memory cells are in great demand. To obtain a miniature high-capacity memory cell, fundamental changes to the conventional method of fabricating memory cells have to be made.

Stack type capacitor has been used in semiconductor cells for quite some time. In the fabrication of deep submicron devices, stack type capacitors continue to be developed. Stack type capacitors are formed into a variety of shapes including crown shape, fin shape, cylindrical shape or spread-out shape. Though stack type capacitor is capable of cramming a large number of memory units into a single cell to create high-density DRAM, forming a memory cell capable of storing 256 megabits (Mb) or higher is still difficult.

FIGS. 1A through 1E are schematic cross-sectional views showing the progression of steps for producing a conventional double-sided crown-shaped capacitor.

As shown in FIG. 1A, a substrate 100 having a device therein is provided. A silicon oxide layer 102 and a silicon nitride layer 104 are sequentially formed over the substrate 100 and the device. The silicon oxide layer 102 functions as an inter-layer dielectric (ILD) while the silicon nitride layer 104 functions as an etching stop layer for forming the double-sided crown-shaped structure. Photolithographic and etching techniques are next applied to form a contact opening 106 through the silicon oxide layer 102 and the silicon nitride layer 104. A doped polysilicon plug 107 is formed inside the contact opening 106.

As shown in FIG. 1B, an insulation layer 108 is formed over the silicon nitride layer 104 and the polysilicon plug 107. Photolithographic and etching processes are then carried out to form an opening 110 in the insulation layer 108 so that the polysilicon plug 107 and a portion of the silicon nitride layer 104 are exposed.

As shown in FIG. 1C, a conformal amorphous silicon layer 112 is formed over the insulation layer 108 and the exposed interior surfaces of the opening 110.

As shown in FIG. 1D, the amorphous silicon layer 112 above the insulation layer 108 is removed using the insulation layer 108 as a polishing stop layer. Ultimately, only an amorphous silicon layer 112a remains inside the opening 110

As shown in FIG. 1E, the insulation layer 108 above the silicon nitride layer 104 is removed using the silicon nitride layer 104 as an etching stop layer. Hence, a double-sided crown-shaped capacitor structure is formed. In a subsequent step, steps may be taken to grow hemispherical polysilicon grains over the exposed amorphous silicon layer 112a. A capacitor dielectric layer and an upper electrode are sequentially formed over the amorphous silicon layer 112a to complete the fabrication of the crown-shaped capacitor.

Although the crown-shaped capacitors formed by the aforementioned method occupy very little space, capacitance of each capacitor is too small to form the memory unit of a 256M or 1 G DRAM.

SUMMARY OF THE INVENTION

Accordingly, one object of the present invention is to provide a method of forming a stack capacitor having a larger electrode surface area so that capacitance of the capacitor is increased.

To achieve these and other advantages and in accordance with the purpose of the invention, as embodied and broadly described herein, the invention provides a method of forming a crown-shaped capacitor. A dielectric layer, a stopping layer and a first material layer are sequentially formed over a substrate, and then a contact plug is formed through the three layers above the substrate. A first doped amorphous silicon layer and a second material layer are sequentially formed over the first material layer and the contact plug. The second material layer and the first doped amorphous silicon layer are patterned to form an opening that exposes the contact plug. A second doped amorphous silicon layer is formed over the exposed surface of the opening and above the second material layer on each side of the opening. The second doped amorphous silicon layer also covers the sidewalls of the second material layer and the first dope amorphous silicon layer to form doped amorphous silicon spacers. The second material layer and the first material layer are removed. The stopping layer is next removed to expose the first doped amorphous silicon layer, the second doped amorphous silicon layer, the doped amorphous silicon spacers and a portion of the contact plug. Hence, the double-sided multiple-crown lower electrode of a stack capacitor is formed. A capacitor dielectric layer and the upper electrode of a capacitor are sequentially formed over the lower electrode structure.

According to the embodiment of this invention, the second doped amorphous silicon layer is formed over the exposed surfaces of the opening and a portion of the top surfaces of the second material layer on each side of the opening. The doped amorphous silicon spacers are formed on the sidewalls of the second material layer and the first doped amorphous silicon layer. The method includes depositing a doped amorphous silicon layer conformal to the substrate profile, and then forming a photoresist layer that fills the opening and covers a portion of the doped amorphous silicon layer above the second material layer. Lastly, an anisotropic etching operation such as reactive ion etching is carried out to remove the exposed amorphous silicon layer above the second material layer.

In the embodiment of this invention, the corners of the double-sided crown-shaped lower electrode structure can be rounded by chemical dry etching. Hence, current leaks near the corners can be prevented.

By forming a double-sided multiple-crown lower electrode, effective surface area of the lower electrode of a capacitor is increased. Hence, capacitance of each memory device is increased.

After forming the double-sided crown-shaped lower electrode structure, hemispherical polysilicon grains may be grown over the exposed surface of the structure so that the effective surface area and hence the capacitance of the capacitor is further increased. The hemispherical polysilicon grains are formed after the etching stop layer (the silicon nitride layer) is removed. Since hemispherical polysilicon grains grow much faster on amorphous silicon instead of silicon oxide, hemispherical polysilicon grains are selectively formed over the exposed surface of the lower electrode structure and not on the dielectric layer. Consequently, short-circuiting problem caused by the growth of hemispherical polysilicon grains over an etching stop layer can be avoided.

In this invention, typical processing methods such as chemical vapor deposition, photolithography and etching are used to increase the memory capacity of memory devices. Because expensive processes such as chemical-mechanical polishing are not used, processing window of this invention is greater. Hence, the steps for fabricating the capacitor are simplified and the cost of production is lowered.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
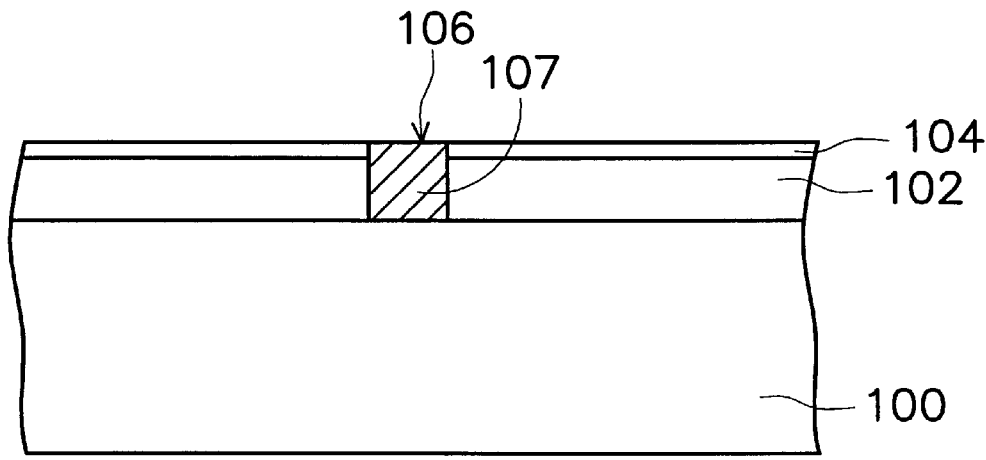
FIGS. 1A through 1E are schematic cross-sectional views showing the progression of steps for producing a conventional double-sided crown-shaped stack capacitor.
Figure 1B:
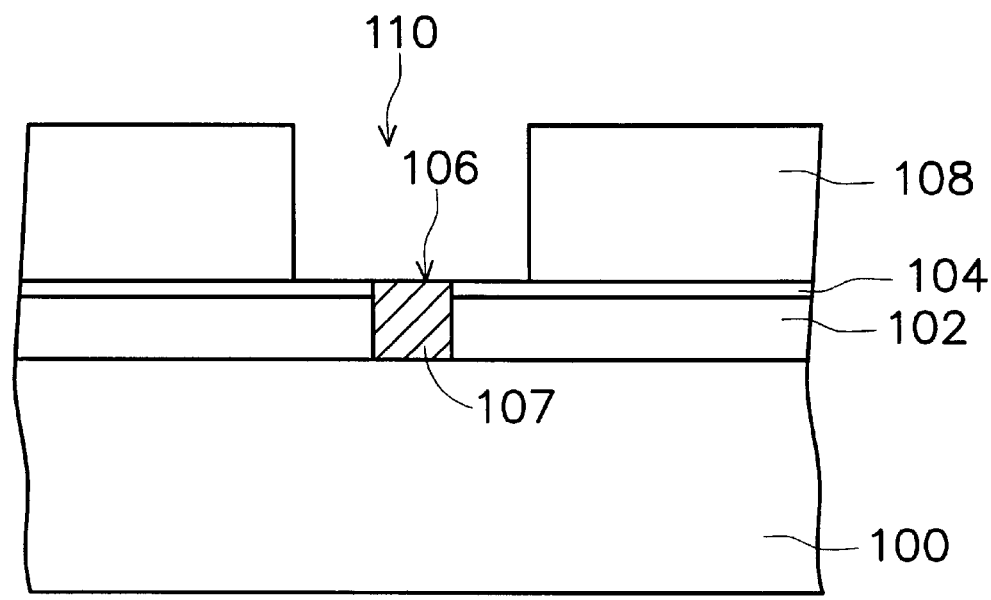
Figure 1C:
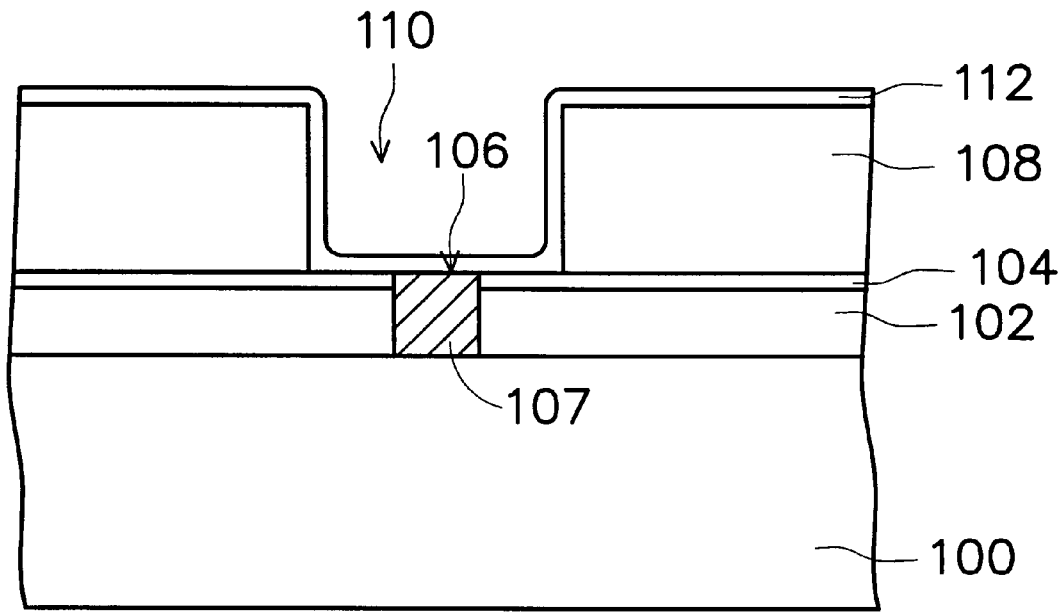
Figure 1D:
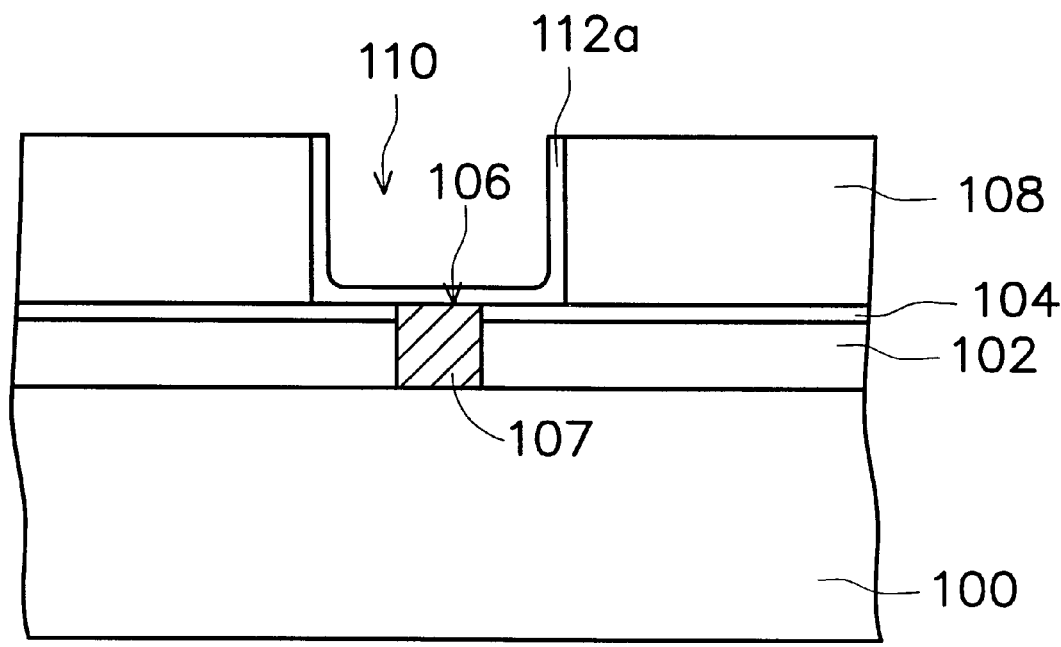
Figure 1E:
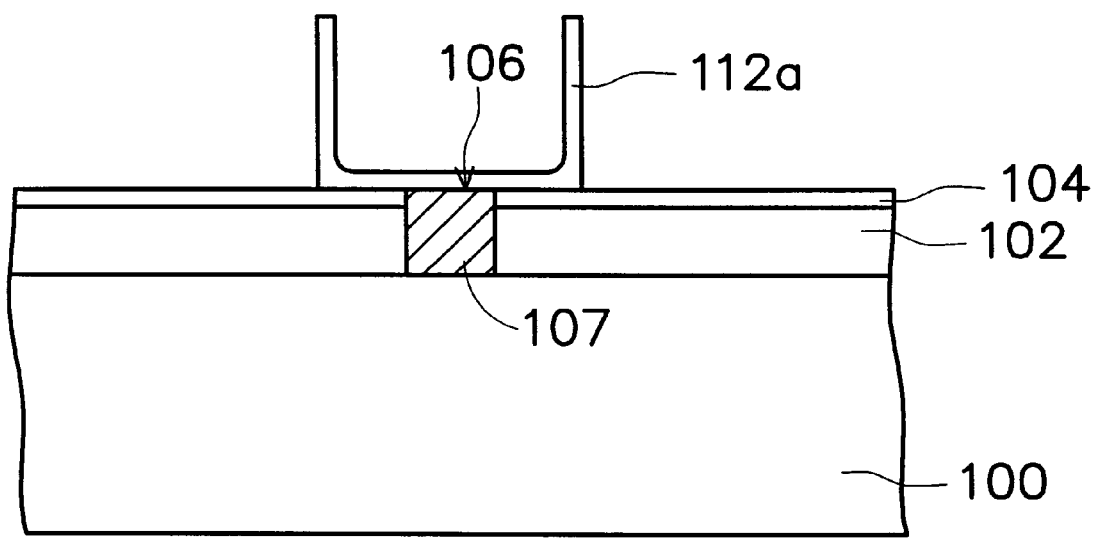

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic cross-sectional views showing the progression of steps for producing a double-sided multiple-crown capacitor according to this invention.

Figure 2A:
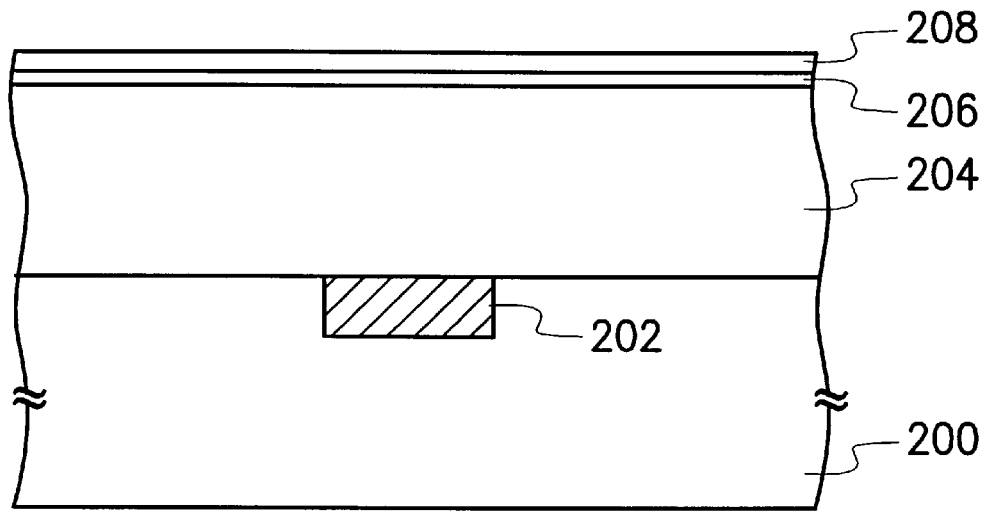
FIGS. 2A through 2F are schematic cross-sectional views showing the progression of steps for producing a double-sided multiple-crown capacitor according to this invention.

As shown in FIG. 2A, a substrate 200 having a device therein is provided. The substrate 200, for example, can be a semiconductor substrate with a field effect transistor whose position is indicated by a region 202 in FIG. 2A. A dielectric layer 204, a stopping layer 206 and a material layer 208 are sequentially formed over the substrate 200 and the device 202. The dielectric layer 204 that serves as an inter-layer dielectric (ILD) can be a silicon oxide layer formed, for example, by chemical vapor deposition. The stopping layer 206 is a protective layer for the dielectric layer 204 in subsequent etching operation. Since the stopping layer 206 must protect the dielectric layer 204 against etching damages, the stopping layer 206 is formed using a material having an etching rate that differs from the dielectric layer 204. The stopping layer 206 having a thickness of about 200 Å to 800 Å can be a silicon nitride layer formed, for example, by chemical vapor deposition. The material layer 208 also has an etching rate that differs from the stopping layer 206. For example, the material layer 208 having a thickness of about 500 Å to 1500 Å can be a silicon oxide layer formed, for example, by chemical vapor deposition.

Figure 2B:
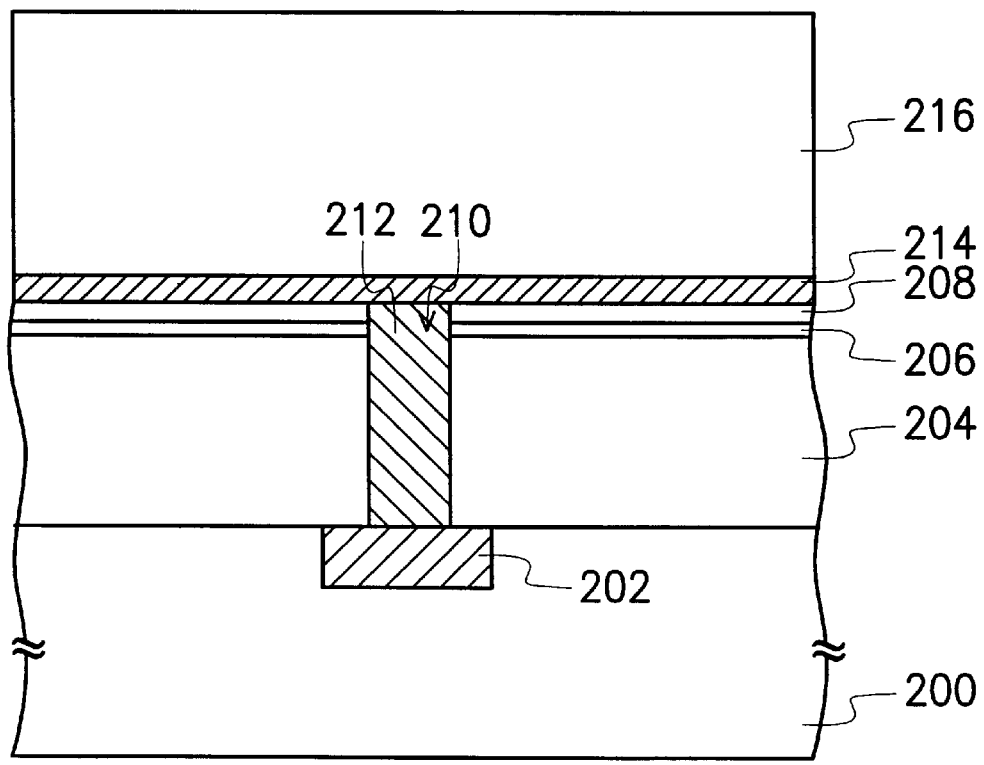

As shown in FIG. 2B, photolithographic and etching techniques are used to form a contact opening 210 through the dielectric layer 204, the stopping layer 206 and the material layer 208. A contact plug 212 is next formed inside the contact opening 210. The contact plug 212 is formed, for example, by depositing conductive material over the material layer 208 to form a conductive layer (not shown in the figure) in chemical vapor deposition process such that the contact opening 210 is completely filled. The conductive layer above the material layer 208 is next removed by reactive ion etching, for example. The conductive layer for forming the contact plug 212 can be a doped polysilicon layer with a dopant concentration of about 5E19 phosphorus atoms per cubic cm, for example.

A doped amorphous silicon layer 214 and a second material layer 216 are sequentially formed over the first material layer 208 and the contact plug 212. The doped amorphous silicon layer 214 having a thickness of about 500 Å to 1000 Å can be formed, for example, by low-pressure chemical vapor deposition using a processing temperature of about 500° C. to 520° C. The dopants inside the amorphous silicon layer 214 can be added in-situ. The material layer 216 has an etching rate that differs from the stopping layer 206. Hence, the material layer 216 is preferably a borophosphosilicate glass (BPSG) layer whose thickness depends on the desired capacitance of the capacitor. In general, the material layer 216 preferably has a thickness of between 3000 Å to 15000 Å.

Figure 2C:
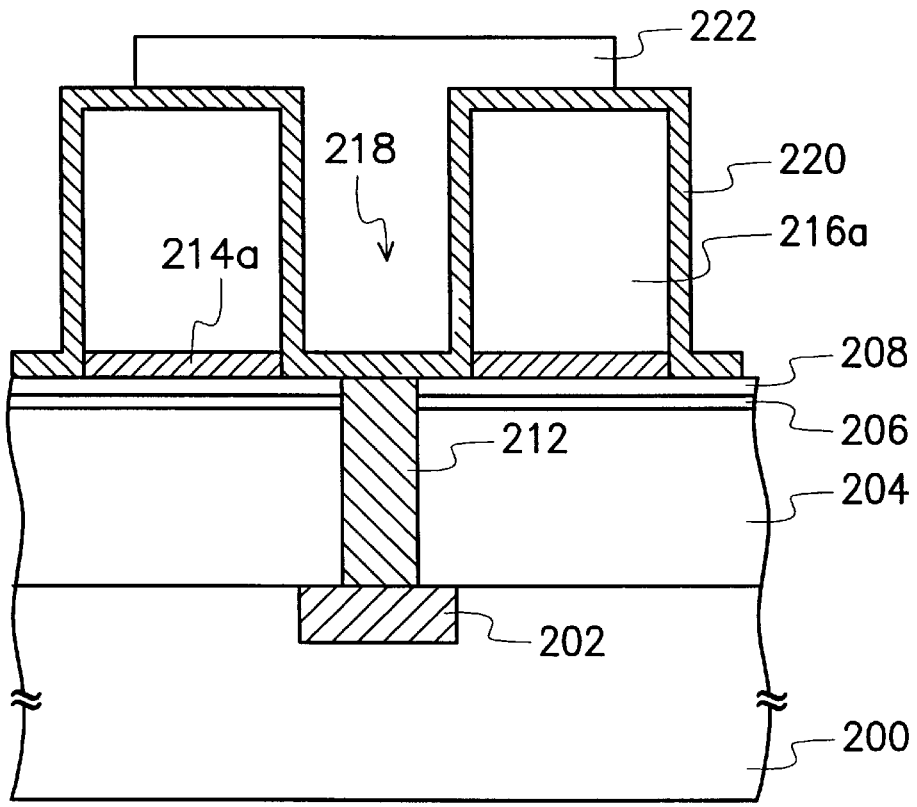

As shown in FIG. 2C, photolithographic and etching processes are carried out to pattern the material layer 216 and the doped amorphous silicon layer 214. Ultimately, an opening 218 is formed between blocks of material layer 216a and doped amorphous silicon layer 214a. The opening 218 exposes the contact plug 212 and a portion of the material layer 208.

Another doped amorphous silicon layer 220 conformal to the substrate profile is formed covering the material layer 208, sidewalls of the amorphous silicon layer 214a, sidewalls and top surface of the material layer 216a as well as the sidewalls and bottom surface of the opening 218. The doped amorphous silicon layer 220 is formed, for example, by low-pressure chemical vapor deposition using a temperature of about 500° C. to 520° C. The dopants inside the amorphous silicon layer 220 can be added in-situ.

A photoresist layer 222 is formed over the substrate 200. This photoresist layer 222 completely fills the opening 218 and covers a portion of the doped amorphous silicon layer 220 above the material layer 216a. In other words, width of the photoresist layer 222 should be greater than the width of the opening 218 but smaller than width of the external sidewalls of the material layer 216a surrounding the opening 218.

Figure 2D:
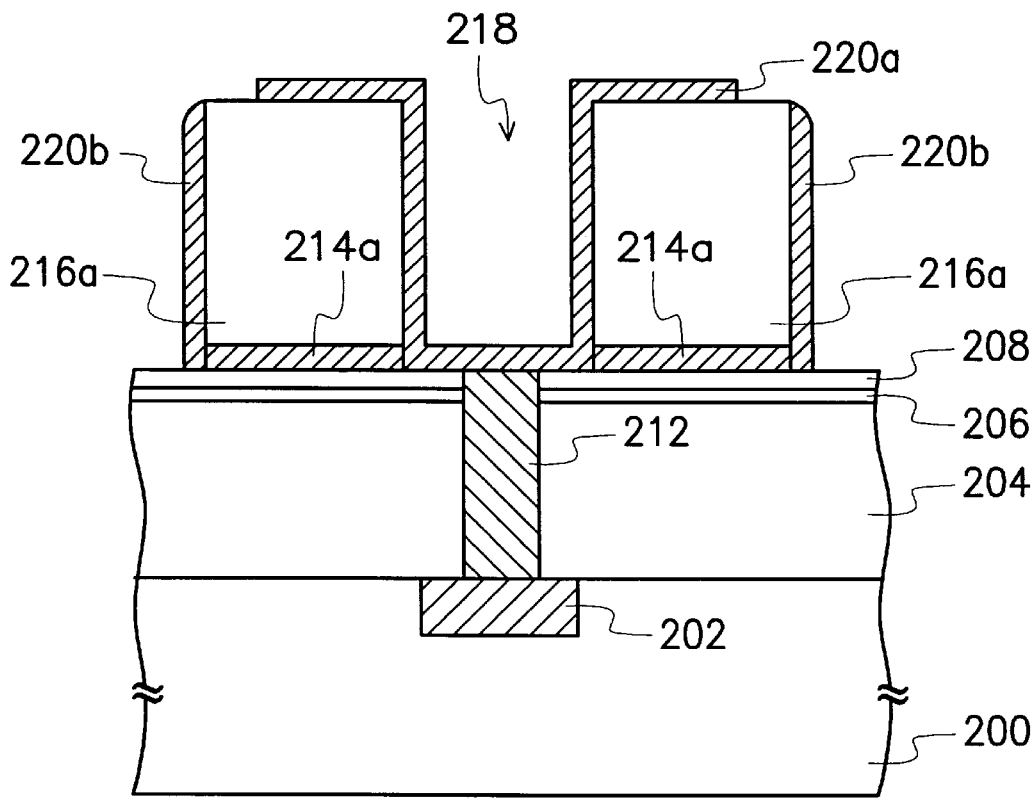

As shown in FIG. 2D, an anisotropic etching operation such as reactive ion etching is carried out to remove a portion of the doped amorphous silicon layer 220. Hence, a portion of the doped amorphous silicon layer 220 hidden under the photoresist layer 222 are retained, thereby forming a doped amorphous silicon layer 220a. In addition, doped amorphous silicon spacers 220b are formed over the external sidewalls of the material layer 216a and the amorphous silicon layer 214a. In the subsequent step, the photoresist layer 222 is removed to expose the doped amorphous silicon layer 220a.

Figure 2E:
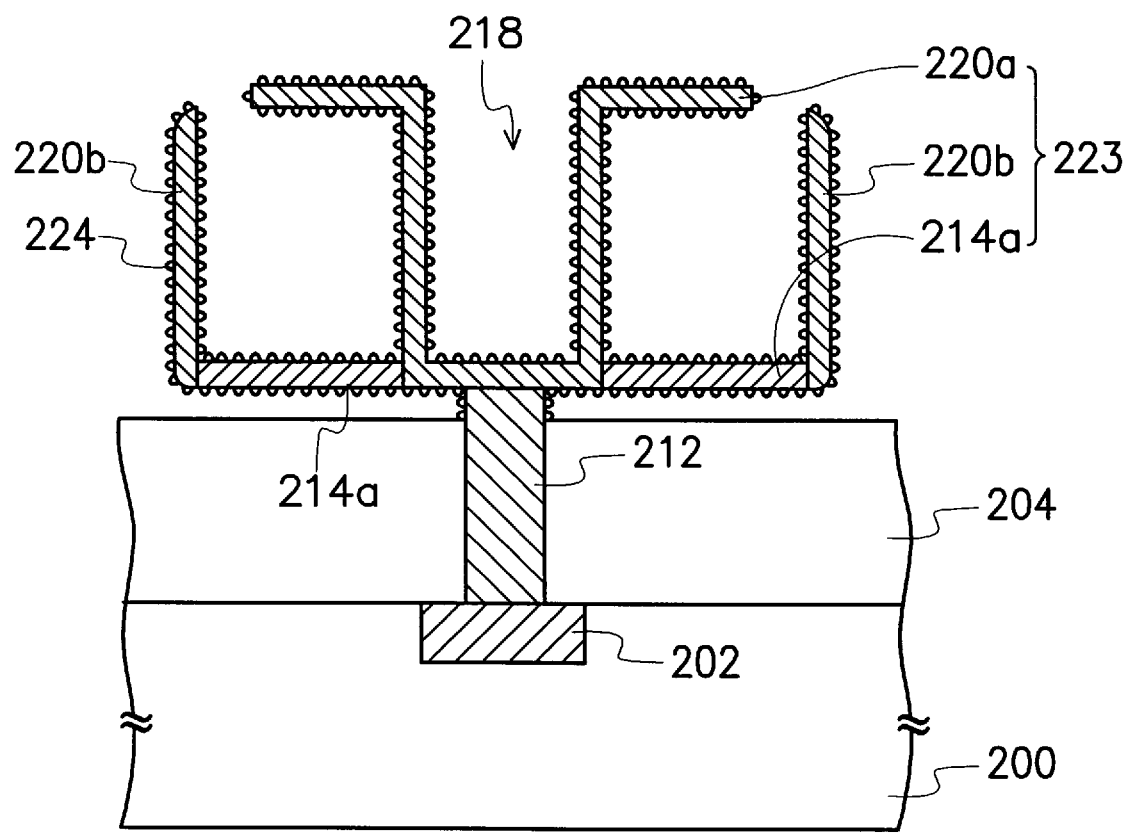

As shown in FIG. 2E, the material layer 216a and the material layer 208 are removed so that the doped amorphous silicon layer 220a, the doped amorphous silicon spacers 220b and the doped amorphous silicon layer 214a are exposed. The doped amorphous silicon layers 220a, 220b and 214a together form the double-sided multiple-crown lower electrode structure 223 of a capacitor. The doped amorphous silicon layer 220a forms the inner crown of the lower electrode structure 223. The doped amorphous silicon spacer 220b and the doped amorphous silicon layer 214a together form the outer crown of the lower electrode structure 223. If the material layer 216a and the material layer 208 have similar etching rates, the material layers 216a and 208 can be removed by wet etching at the same time. For example, if the material layer 208 is a silicon oxide layer while the material layer 216a is a borophosphosilicate glass (BPSG) layer, buffer oxide etchant (BOE) can be used as an etching solution in the wet etching step. Because the stopping layer 206 has an etching rate that differs from the material layer 216a and/or the material layer 208, the stopping layer 206 is able to protect the dielectric layer 204 underneath it.

To prevent current leaks near the corner regions of the structure 223, an isotropic etching operation is preferably conducted to smooth out the corners immediately after the structure 223 is exposed. The isotropic etching operation includes, for example, a chemical dry etching (CDE) operation.

The stopping layer 206 is removed, and then hemispherical polysilicon grains 224 are formed over the exposed surface of the lower electrode structure 223. The hemispherical polysilicon grains 224 can be formed, for example, by forming nuclei of silicon grains on the exposed surface of the lower electrode structure 223 using silane or disilane ($Si_2H_6$) in a high-vacuum ($10^{-3}$ to $10^{-4}$ Torr). A thermal treatment is next carried out in an ultra-high vacuum ($10^{-8}$ to $10^{-9}$ Torr) so that silicon atoms on the surface of the lower electrode structure 223 can migrate to nuclei to form hemispherical polysilicon grains 224.

Figure 2F:
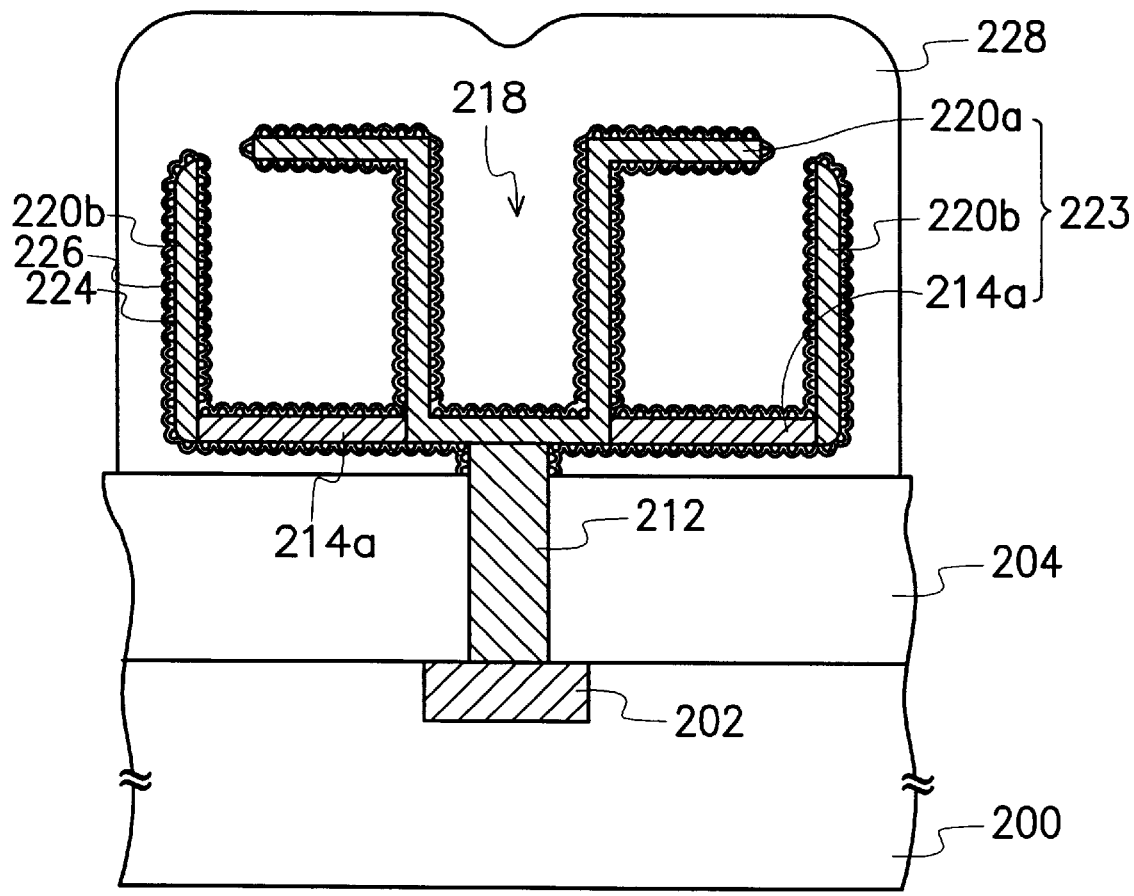

After forming the lower electrode structure 223, a capacitor dielectric layer 226 and an upper electrode 228 are sequentially formed as shown in FIG. 2F. The dielectric layer 226 can be a $Ta_2O_5$ layer formed, for example by chemical vapor deposition. The upper electrode 228 can be a doped polysilicon layer formed, for example, by chemical vapor deposition.

In this invention, the comers of the double-sided crown-shaped lower electrode structure can be rounded by chemical dry etching. Hence, current leaks near the comer regions can be prevented. By forming a double-sided multiple-crown lower electrode, effective surface area of the lower electrode of a capacitor is increased. Hence, capacitance of each memory device is increased.

After forming the double-sided crown-shaped lower electrode structure, hemispherical polysilicon grains may be grown over the exposed surface of the structure so that the effective surface area and hence the capacitance of the capacitor is further increased. The hemispherical polysilicon grains are formed after the etching stop layer (the silicon nitride layer) is removed. Since hemispherical polysilicon grains grow much faster on amorphous silicon instead of silicon oxide, hemispherical polysilicon grains are selectively formed on the exposed surface of the lower electrode structure and not on the dielectric layer. Consequently, short-circuiting problem caused by the growth of hemispherical polysilicon grains over an etching stop layer can be avoided.

In this invention, typical processing methods such as chemical vapor deposition, photolithography and etching are used to increase the memory capacity of memory devices. Because expensive processes such as chemical-mechanical polishing are not used, processing window of this invention is greater. Hence, the steps for fabricating the capacitor are simplified and the cost of production is lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a crown-shaped capacitor, comprising the steps of:

providing a substrate;

forming a dielectric layer, a stopping layer and a first material layer over the substrate;

forming a contact plug through the dielectric layer, the stopping layer and the first material layer;

forming a first doped amorphous silicon layer and a second material layer over the contact plug and the first material layer;

patterning the second material layer and the first doped amorphous silicon layer to form an opening through the second material layer and the first doped amorphous silicon layer, wherein the opening exposes the contact plug and a portion of the first material layer;

forming a second doped amorphous silicon layer conformally an interior over surface of the opening and a portion of a top surface of the second material layer on each side of the opening, and forming doped amorphous silicon spacers on sidewalls of the second material layer and the first doped amorphous silicon layer;

removing the second material layer and the first material layer to expose the first doped amorphous silicon layer, the second doped amorphous silicon layer, the doped amorphous silicon spacers and a portion of the contact plug so that a lower electrode structure of the crown-shaped capacitor is formed;

removing the stopping layer;

forming a capacitor dielectric layer over the exposed surface of the lower electrode structure; and forming a conductive upper electrode over the capacitor dielectric layer.

2. The method of claim 1, wherein before the step of forming the capacitor dielectric layer, further includes a chemical dry etching process to round out corners of the lower electrode structure.

3. The method of claim 2, wherein after the step of carrying out chemical dry etching but before the step of forming the capacitor dielectric layer, further includes forming hemispherical polysilicon grains over the exposed surface of the lower electrode structure.

4. The method of claim 1, wherein before the step of forming the capacitor dielectric layer, further includes forming hemispherical polysilicon grains over the exposed surface of the lower electrode structure.

5. The method of claim 1, wherein the first material layer and the stopping layer have different etching rates.

6. The method of claim 1, wherein the second material layer and the first material layer have similar etching rates.

7. The method of claim 1, wherein the second material layer and the stopping layer have different etching rates.

8. The method of claim 1, wherein the first material layer and the second material layer are removed in same etching step.

9. The method of claim 1, wherein the step of removing the first and the second material layer include wet etching.

10. The method of claim 1, wherein the step of removing the stopping layer includes wet etching.

11. A method of forming a crown-shaped capacitor, comprising the steps of:

providing a substrate;

forming a dielectric layer, a stopping layer and a first material layer over the substrate;

forming a contact plug through the dielectric layer, the stopping layer and the first material layer;

forming a first doped amorphous silicon layer and a second material layer over the contact plug and the first material layer;

patterning the second material layer and the first doped amorphous silicon layer to form an opening through the second material layer and the first doped amorphous silicon layer, wherein the opening exposes the contact plug and a portion of the first material layer;

forming a second doped amorphous silicon layer that conforms to the opening;

forming a photoresist layer over the second doped amorphous silicon layer, wherein the photoresist layer fills the opening and covers a portion of the second doped amorphous silicon layer above the second material layer;

removing portions of the second doped amorphous silicon layer not covered by the photoresist layer by performing an anisotropic etching operation so that the second doped amorphous silicon layer lying under the photoresist layer and on sidewalls of the second material layer and the first doped amorphous silicon layer are retained wherein the sidewalls comprise doped amorphous silicon spacers;

removing the second material layer and the first material layer by wet etching so that the first doped amorphous silicon layer, the second doped amorphous silicon layer, the doped amorphous silicon spacers, and a portion of the contact plug remain to form a lower electrode structure of the crown-shaped capacitor wherein the step of removing also exposes a surface of the lower electrode structure;

rounding corners of the lower electrode structure by chemical dry etching;

removing the stopping layer by wet etching;

growing hemispherical polysilicon grains over the exposed surface of the lower electrode structure;

forming a capacitor dielectric layer over the exposed surface of the lower electrode structure; and forming a conductive upper electrode over the capacitor dielectric layer.

12. The method of claim 11, wherein the first material layer and the stopping layer have different etching rates.

13. The method of claim 11, wherein the second material layer and the first material layer have similar etching rates.

14. The method of claim 11, wherein the second material layer and the stopping layer have different etching rates.

15. The method of claim 11, wherein the step of removing the second doped amorphous silicon layer includes reactive ion etching.

* * * * *